United States Patent [19]
Phillips et al.

[11] Patent Number: 5,808,484
[45] Date of Patent: *Sep. 15, 1998

[54] METHOD AND APPARATUS FOR DETECTING CHANGES IN A CLOCK SIGNAL TO STATIC STATES

[75] Inventors: Sabrina D. Phillips, Garland; James R. Hellums, Dallas, both of Tex.

[73] Assignee: Texas Instruments Incorporated, Dallas, Tex.

[ * ] Notice: The term of this patent shall not extend beyond the expiration date of Pat. No. 5,589,784.

[21] Appl. No.: 483,665

[22] Filed: Jun. 7, 1995

Related U.S. Application Data

[62] Division of Ser. No. 310,354, Sep. 21, 1994, Pat. No. 5,589,784, which is a continuation of Ser. No. 237,949, May 2, 1994, abandoned, which is a continuation of Ser. No. 861,721, Mar. 31, 1992, abandoned.

[51] Int. Cl.$^6$ .................................................. H03K 5/19
[52] U.S. Cl. ................................ 327/18; 327/26; 327/31; 327/34; 327/131; 327/133; 327/171; 327/172; 327/551; 327/132
[58] Field of Search .................................. 327/14, 15, 17, 327/18, 31, 33, 131, 132, 133, 551, 26, 32, 34, 78, 88, 89, 172, 175, 181, 20, 35

[56] References Cited

U.S. PATENT DOCUMENTS

| | | | |
|---|---|---|---|
| 3,564,285 | 2/1971 | Gilbert | 327/26 |
| 3,621,281 | 11/1971 | Hagen | 327/133 |
| 3,712,992 | 1/1973 | Schertz et al. | 327/174 |
| 3,798,467 | 3/1974 | Gottwald | 327/79 |
| 3,852,616 | 12/1974 | Carp et al. | 327/31 |
| 3,906,247 | 9/1975 | Heffner | 327/263 |
| 4,180,750 | 12/1979 | Ozawa et al. | 327/374 |
| 4,230,970 | 10/1980 | Potter et al. | 327/31 |
| 4,404,481 | 9/1983 | Ide et al. | 327/172 |
| 4,413,237 | 11/1983 | Baba | 327/131 |
| 4,471,326 | 9/1984 | Steckler et al. | 327/131 |
| 4,521,694 | 6/1985 | Ryczek et al. | 327/172 |
| 4,599,525 | 7/1986 | Tzeng | 327/34 |
| 4,603,299 | 7/1986 | Monett | 327/58 |
| 4,603,357 | 7/1986 | Ramiréz et al. | 327/58 |
| 4,626,702 | 12/1986 | Chito | 327/132 |
| 4,626,705 | 12/1986 | Raver | 327/172 |
| 4,633,097 | 12/1986 | Dewitt | 327/20 |
| 4,667,118 | 5/1987 | Maruta | 327/172 |
| 4,803,381 | 2/1989 | Gornati | 327/132 |
| 4,845,379 | 7/1989 | Carlsten | 327/20 |
| 4,864,163 | 9/1989 | Nakao et al. | 327/84 |

FOREIGN PATENT DOCUMENTS

| | | | |
|---|---|---|---|
| 57-11528 | 1/1982 | Japan | 327/20 |
| 1-189223 | 7/1989 | Japan | 327/20 |
| 6-37610 | 2/1994 | Japan | 327/20 |

*Primary Examiner*—Terry Cunningham
*Attorney, Agent, or Firm*—Warren L. Franz; Mark E. Courtney; Richard L. Donaldson

[57] ABSTRACT

An integrated detection circuit (10) linearly charges capacitors (14) and (16) over time in response to particular states of an input signal (12). Outputs from the integrated detection circuit (10) are generated by differential pairs (39) when the charge on either of the capacitors (14) or (16) is equal to or greater than a reference voltage input to the differential pairs (39).

5 Claims, 1 Drawing Sheet

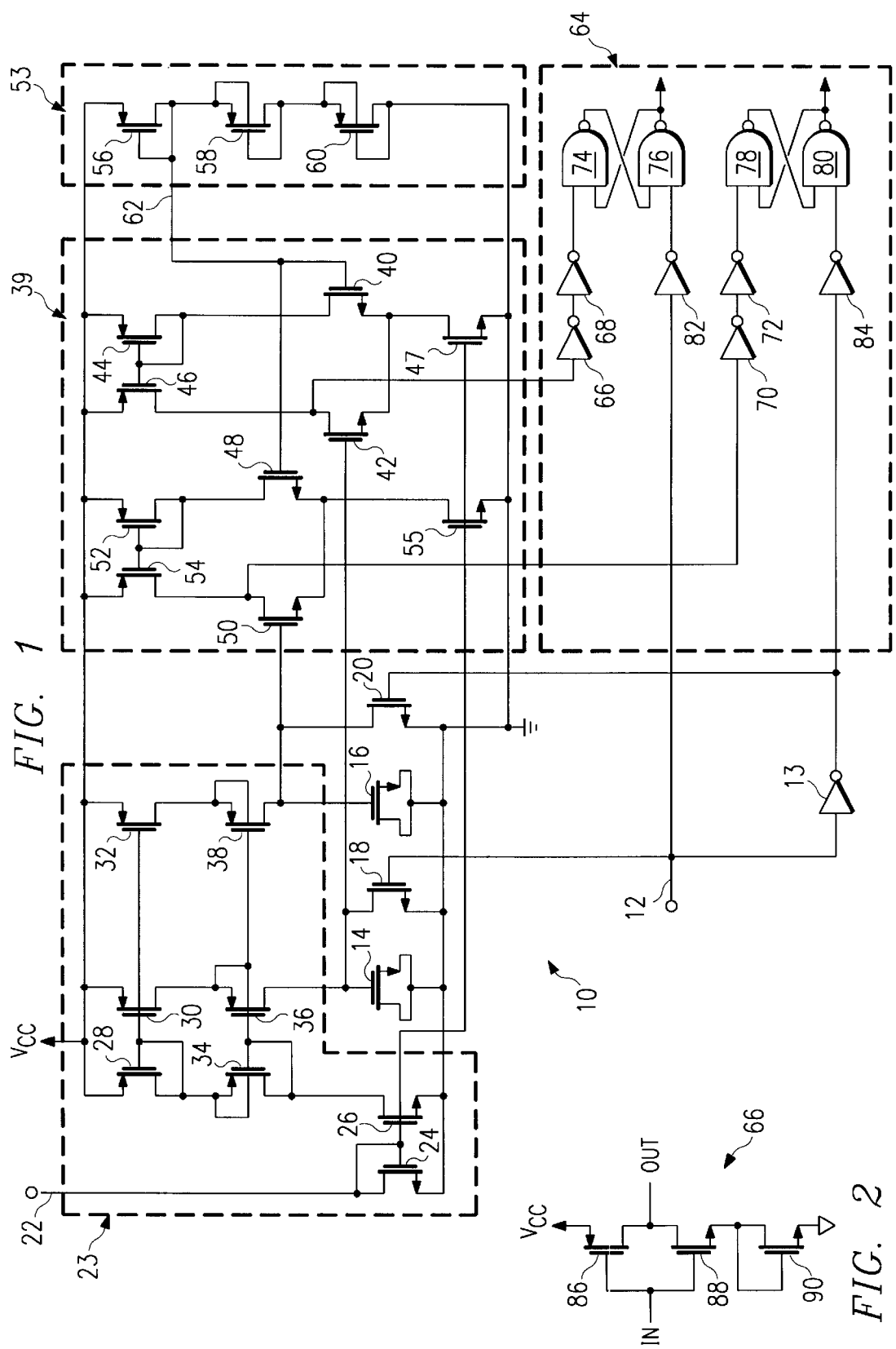

METHOD AND APPARATUS FOR DETECTING CHANGES IN A CLOCK SIGNAL TO STATIC STATES

This is a divisional of application Ser. No. 08/310,354, filed Sep. 21, 1994, now U.S. Pat. No 5,589,784; which is a continuation of application Ser. No. 08/237,949 filed May 02, 1994, now abandoned; which is a continuation of application Ser. No. 07/861,721 filed Mar. 31, 1992, now abandoned.

TECHNICAL FIELD OF THE INVENTION

This invention relates in general to the field of electronic circuits, and more particularly to an integrated circuit and method for detecting changes in a clock signal to static states.

BACKGROUND OF THE INVENTION

A clock signal is a signal that alternates between high and low logic states periodically at set time intervals to provide a series of lock pulses which serve as timing references for electrical try synchronization puroses. The number of clock pulse cycles or periods that occurs per unit time is referred to as the clock frequency.

A need frequently arises in electronic circuits to detect when a clock signal changes from its normal periodically alternating state to a particular unchanging static state for a given amount of time. For example, a clock signal may be raised to a high logic level (such as 5 volts) for a certain amount of time to indicate that a test sequence is about to begin, and a circuit is needed to measure that time.

An example of a detection circuit that has been developed for such needs is a capacitive charging circuit designed with a time constant suited to the needs of the application. In integrated electronic circuits, however, such capacitive charging circuits do not present attractive solutions because of the valuable space required to fabricate capacitors. For example, a circuit designed with a time constant of $625 \times 10^{-6}$ seconds and using a 200 pF capacitor could require 500,000 $\mu m^2$ to fabricate the capacitor. Such sizes are unacceptable in integrated electronic circuits, where device density is a premier consideration.

Another technique that has been used avoids the penalty of large capacitors by varying the size of output logic devices coupled to relatively small capacitors. By this technique, output logic devices (such as metal oxide semiconductor field effect transistors, or MOSFETs) are sized so as to "turn on" or "turn off" at higher than typical voltages. For example, by increasing the width of the channel in a MOSFET, the transistor can be made to "turn on" at, for example, 4.5 volts, rather than a more typical 2.5 volts. By coupling such differently sized transistors to the outputs of relatively small capacitors, the time constant of the circuit is effectively increased, since an output signal will not be generated until the capacitor is charged high enough to trip the output transistors. This technique, however, is also unattractive, since it requires precisely-sized transistors for precise time constants, and accurately reproducing precisely the same size transistor from batch to batch, or process to process, is problematic. Moreover, variations in temperature and power supply will cause varying "turn on" and "turn off" voltages, resulting in varying time constants within the same circuit.

Therefore, a need has arisen for an integrated circuit design for detecting changes in a clock signal to static states with a relatively long time constant that maximizes device density by avoiding the use of large capacitors, and that provides a consistently reproducible time constant.

SUMMARY OF THE INVENTION

In accordance with the present invention, an integrated circuit for detecting changes in a clock signal to static states is provided which substantially eliminates disadvantages and problems associated with prior such circuits. The integrated detection circuit of the present invention is composed of a capacitor that charges in response to a first static state of a clock signal. The capacitor is coupled to a differential pair so that an output is generated from the differential pair when the charge from the capacitor is greater than or equal to a reference voltage that is input to the differential pair.

In another embodiment of the present invention, two charging capacitors are used, such that each is charged in response to a particular static state of the clock signal. Each of the capacitors is coupled to a differential pair. An output is generated from each differential pair when the capacitor coupled to that differential pair charges to a voltage equal to or greater than a reference voltage signal input to that differential pair.

An important technical advantage of the present invention inheres in the fact that an output is generated from a differential pair when the capacitor coupled to that differential pair is charged to a reference voltage. By this technique, circuits with consistently reproducible time constants can be consistently and inexpensively fabricated. Another important technical advantage of the present invention inheres in the fact that the capacitor is charged linearly over time, rather than exponentially.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 is a schematic circuit diagram of a circuit for detecting a change in a clock signal to static states constructed according to the teachings of the present invention; and FIG. 2 is a schematic circuit diagram of an output inverter constructed according to the teachings of the present invention.

DETAILED DESCRIPTION OF THE INVENTION

FIG. 1 is a schematic diagram of an integrated detection circuit 10 constructed according to the teachings of the present invention. An input signal 12, such as a clock signal, is detected by circuit 10, such that circuit 10 generates output signals indicating whether input signal 12 has been held at a particular (static) state for a given amount of time. According to the embodiment described in FIG. 1, circuit 10 is operable to output signals indicating whether input signal 12 has been held high (e.g., 5 volts) for a certain amount of time, or held low (e.g., 0 volts) for a given amount of time. It should be recognized that the teachings of the present invention include a circuit capable of generating an output signal in response to an input signal being held in only one state for a given amount of time, as well as a circuit capable of generating output signals in response to an input signal being held in either one of two states for a given amount of time.

Capacitors 14 and 16 are charged in response to the state of input signal 12. Capacitors 14 and 16 are fabricated according to integrated circuit technologies and may comprise metal oxide semiconductors field effect transistors [MOSFETs] with the source, drain, and substrate coupled to ground, as shown in FIG. 1. In FIG. 1, capacitor 14 is charged when input signal 12 is low. Input signal 12 is coupled to the gate of transistor 18, the source of which is coupled to ground and the drain of which is coupled to the positive electrode of capacitor 14. In this manner, capacitor 14 will be charged when input signal 12 is low, but will not be charged (and will be discharged) when input signal 12 is high, since in the high state transistor 18 will couple the positive electrode of capacitor 14 to ground, thereby preventing its charging.

Likewise, capacitor 16 is charged when input signal 12 is high. Input signal 12 is coupled to the gate of transistor 20 through inverter 13. The source of transistor 20 is coupled to ground and the drain is coupled to the positive electrode of capacitor 16. Therefore, capacitor 16 will only charge when transistor 20 is off, which corresponds to input signal 12 being in its high state, and will be discharged when input signal 12 is low. Transistors 18 and 20 comprise selection circuitry, since they select which of capacitors 14 and 16 is to be charged.

Capacitors 14 and 16 are linearly charged over time through charging circuitry by a current derived from a biasing current 22. Biasing current 22 may be reduced by current mirror 23 so as to provide a charging current for capacitors 14 and 16 that is greater than the leakage current of those capacitors. As an example of a particular embodiment, biasing current 22 is approximately 15 microamps, and current mirror 23 reduces the charging current to capacitors 14 and 16 to approximately 200 nanoamps, with capacitors 14 and 16 having a capacitance of approximately 35 pF.

Current mirror 23 is used to reduce the biasing current so that a relatively small current charges capacitors 14 and 16. Current mirror 23 acts as a current source with a high output impedance, such that capacitors 14 and 16 are charged linearly over time (i.e., the change in voltage over time is linear), rather than exponentially. In effect, current mirror 23 and capacitors 14 and 16 behave like an integrator circuit rather than an RC circuit.

Current mirror 23 may comprise two discrete current mirrors, one comprised of transistors 24 and 26, the other comprised of transistors 28, 30, and 32. As shown in FIG. 1, the drain of transistor 24 is coupled to biasing current 22 and to the gate of transistor 24 while the source of transistor 24 is coupled to ground. The gate of transistor 24 is also coupled to the gate of transistor 26. The source of transistor 26 is coupled to ground.

The current mirror comprised of transistors 28, 30, and 32 may be constructed by coupling the source of transistor 28 to $V_{cc}$ (which may, for example, be 5 volts), and the gate of transistor 28 to its drain and to the gates of transistors 30 and 32. Transistors 30 and 32 provide the charging current for capacitors 14 and 16, respectively. The sources of transistors 30 and 32 are coupled to $V_{cc}$. The drain of transistor 28 is coupled to the source of transistor 34, and the gate of transistor 34 is coupled to the drain of transistor 34 and to the gate of transistor 36. The source of transistor 36 is coupled to the drain of transistor 30. The drain of transistor 36 is coupled to the positive electrode of capacitor 14. The gate of transistor 38 is coupled to the gate of transistor 34. The source of transistor 38 is coupled to the drain of transistor 32. The drain of transistor 38 is coupled to the positive electrode of capacitor 16. Transistors 34, 36, and 38 provide a high impedance cascode output for current mirror 23. The current supplied by transistors 30 and 32 charges capacitors 14 and 16 linearly over time, and thus there is no RC time constant involved in the charging of transistors 30 and 32.

The positive electrodes of capacitors 14 and 16 are coupled to two differential pairs, indicated generally at 39 in FIG. 1. The first differential pair comprises transistors 40, 42, 44, 46, and 47, and the second differential pair comprises transistors 48, 50, 52, 54, and 55. The purpose of these differential pairs is to output signals when capacitors 14 or 16 have been charged to given values. As an example, the differential pairs shown in FIG. 1 can be configured to output signals when capacitors 14 and 16 have charged to approximately 4 volts. With a charging current of 200 nanoamps and a capacitance of approximately 35 pF, a time constant of approximately 625 microseconds will be realized. Thus, to complete the example, when input signal 12 is in a high or low state for 625 microseconds, output signals indicating these conditions will be generated by the differential pairs 39.

By using these differential pairs to generate output signals, and by charging capacitors 14 and 16 linearly over time, consistently reproducible time constants can be achieved. This consistency inheres in the fact that the capacitors are linearly charged and the operation of the differential pairs is a function of the relative sizes of transistors (which can be well-controlled)—not specially sized transistors.

The operation of the differential pair comprising transistors 40, 42, 44, 46 and 47 will be discussed in connection with FIG. 1. It should be understood that other differential pairs offering the same functionality can be used without departing from the teachings herein. As shown in FIG. 1, the gate of transistor 40, the reference voltage input, is coupled to a reference voltage. The input to this differential pair, the gate of transistor 42 is coupled to the positive electrode of capacitor 14. Furthermore, the output of this differential pair is taken from the drain of transistor 42.

In general, a constant current will flow through biasing transistor 47. If the voltage at the gate of transistor 40 is greater than that at the gate of transistor 42, then negligible current will flow through transistor 42 and most of the current flowing through transistor 47 will flow from transistor 40. If the voltage on the gates of transistors 42 and 40 are equal, then equal current will flow through both transistors. Once the voltage at the gate of transistor 42 is greater than that at the gate of transistor 40, most of the current flowing through transistor 47 will flow through transistor 42.

Transistors 44 and 46 ensure that the voltage appearing at the output of the differential pair is, in this particular embodiment, close to $V_{cc}$ when capacitor 14 is not charged to the desired level. The sources of transistors 44 and 46 are connected to $V_{cc}$. The gates of transistors 44 and 46 are coupled together, and the drain of transistor 44 is also coupled to the gate of transistor 44. The drain of transistor 44 is also coupled to the drain of transistor 40, and likewise the drain of transistor 46 is coupled to the drain of transistor 42. The output of this differential pair is taken at the drain of transistor 42. Once capacitor 14 has charged to a voltage equal to or greater than that on the gate of transistor 40, current will flow through transistor 42 thereby pulling the drain of transistor 42 down to a voltage level above ground by the drain-source voltage drops of transistors 42 and 47.

As shown in FIG. 1, the source of transistors 40 and 42 are commonly coupled to the drain of transistor 47, the source of which is coupled to ground and the gate of which is coupled to biasing current input 22. Transistor 47 pulls current through the differential pair.

By choosing the voltage to be placed on the reference voltage input, the time constant of circuit 10 may be adjusted. For example, if this voltage is 4 volts, then only negligible current will flow through transistor 42 until capacitor 14 is charged to a level of 4 volts. Because the current that is used to charge capacitor 14 through current mirror 23 is known, and the capacitance of capacitor 14 is known, the time constant of circuit 10 is easily calculated and adjusted by controlling the voltage on the gate of transistor 40. The time constant of the circuit may be derived by using the formula:

$$I = C \times \frac{\delta v}{\delta t},$$

where
I=charging current,
C=capicitance,
δv=change in voltage, and
δt=the time to charge.

For example, with a capacitance of 35 pF and a current of 200 nanoamps charging capacitor 14, it will take 625 microseconds to charge to 4 volts. Thus, if circuit 10 is to output a signal when input signal 12 has been held low for 625 microseconds, then 4 volts should be placed on the gate of transistor 40, the reference voltage input.

The differential pair comprising transistors 48, 50, 52, 54, and biasing transistor 55 operates the same as the differential pair discussed above. The gate of transistor 48 is coupled to a reference voltage (as described in connection with transistor 40). The gate of transistor 50 is coupled to the positive electrode of capacitor 16. Thus, when capacitor 16 charges to a voltage greater than that on the gate of transistor 48, current will flow through transistor 50 thereby pulling its drain voltage down. According to one embodiment, the coupling between transistors 48, 50, 52, 54, and 55 is the same as that between transistors 40, 42, 44, 46, and 47, as shown in FIG. 1.

As shown in FIG. 1, the gates of transistors 40 and 48 are coupled together. Because capacitors 14 and 16 are identical, the circuit shown in FIG. 1 produces an output signal when input signal 12 is held high or low for the same amount of time, for example, 625 microseconds. It should be understood that by placing a different reference voltage on the gates of transistors 40 and 48, the reference voltage inputs, output signals from the two differential pairs will be generated at different time constants. For example, if 4 volts is placed on the gate of transistor 40 and 3 volts is placed on the gate of transistor 48, an output will be generated from the drain of transistor 42 only after capacitor 14 charges to 4 volts whereas an output will be generated from the drain of transistor 50 when capacitor 16 charges to 3 volts. Thus, a shorter time constant would thereby be effected in conjunction with capacitor 16 than with capacitor 14.

As discussed previously, outputs from the differential pairs are generated at the drains of transistors 42 and 50 only after capacitors 14 and 16 are charged to a level equal to or greater than that placed on the gates of transistors 40 and 48. The selection of the voltage to be placed on the gates of transistors 40 and 48 effectively determines the time constant of circuit 10 for a given capacitance of capacitors 14 and 16 and a given charging current from current mirror 23. The higher the voltage placed on the gates of transistors 40 and 48, the longer the time constant of the circuit 10, and conversely, the lower the voltage, the lower the time constant. The time constant of the circuit can also be changed by altering the capacitance of capacitors 14 and 16 and/or the charging current of current mirror 23.

According to one embodiment, the voltage placed on the gates of transistors 40 and 48 is derived from voltage divider 53. Voltage divider 53 comprises three transistors, 56, 58, and 60. The source of transistor 56 is coupled to $V_{cc}$. The gate and drain of transistor 56 are coupled together to the gate of transistors 40 and 48, represented by node 62. Node 62 is also coupled to the source of transistor 58, as well as to the substrate of transistor 58. The gate of transistor 58 is coupled to the drain of transistor 58 as well as to the source and substrate of transistor 60. The drain and gate of transistor 60 are coupled to ground. According to one embodiment, with $V_{cc}$=5 volts, this voltage divider places approximately 4 volts on the gates of transistors 40 and 48, thereby requiring capacitors 14 and 16 to charge to 4 volts before output signals will be generated at the drains of transistors 42 and 50. The voltage generated at node 62 depends on the sizes of transistors 56, 58, and 60. For equally sized transistors, and $V_{cc}$=5 volts, the voltage at node 62 would equal 3.33 volts.

The outputs of the differential pairs 39, generated at the drains of transistors 42 and 50 may be output to output logic 64. Because the voltage generated at the outputs of differential pairs 39 is not a "true" digital value (e.g., 0 volts or 5 volts) when capacitors 14 and 16 are charged to the desired level, these outputs should be input to circuitry capable of converting them to "true" digital values. Inverters 66 and 70 of output logic 64 accomplish this in the embodiment shown in FIGS. 1 and 2. It will be understood that other circuits can be used to accomplish this conversion. The inverters 66 and 70 provide reliably reproducible circuits for performing this function, since, among other things, their operation is not dependent upon skewing the sizes of transistors.

Output logic 64 may be suited to the application in which circuit 10 is used in any particular embodiment. The following discussion is for purposes of teaching the present invention and describes the embodiment of output logic 64 shown in FIG. 1 and FIG. 2 and should not be construed to limit the teachings of the present invention to this or any particular embodiment.

The drain of transistor 42 is coupled through two inverters 66 and 68 to the input of NAND-gate 74. NAND-gate 74 is cross-coupled to NAND-gate 76 such that the output of NAND-gate 74 is an input to NAND-gate 76 and the output of NAND-gate 76 is an input to NAND-gate 74. Another input to NAND-gate 76 is the output of inverter 82 the input of which is input signal 12. Likewise, the gate of transistor 50 is coupled through inverters 70 and 72 to the input of NAND-gate 78. The output of NAND-gate 78 is input to NAND-gate 80. The output of NAND-gate 80 in turn is coupled to the other input of NAND-gate 78. Another input to NAND-gate 80 is the output of inverter 84. The input of inverter 84 is the output of inverter 13. The input of inverter 13 is input signal 12.

As shown in FIG. 1, output logic 64 produces active low outputs, such that when input signal 12 is high for a given amount of time (e.g., 625 microseconds) a high detect signal will be output from NAND-gate 80. Similarly, when input signal 12 is low for a given amount of time (e.g., 625 microseconds), an active low signal will be generated from NAND-gate 76.

One particular embodiment of inverters 66 and 70 is shown in detail in FIG. 2, and is comprised of the transistors shown in FIG. 2 to ensure that no output signal is generated until capacitors 14 and 16 have charged to the desired level. Because of the voltage drop across transistors 42, 47, 50 and 55, a voltage higher than ground (approximately 3 volts, for example) appears on the drains of transistors 42 and 50 when capacitors 14 and 16 are charged to the desired level. Because this voltage is higher than ground, special inverters 66 and 70 are coupled to these outputs to ensure that high outputs are generated at the inverter outputs when the capacitors are charged to the desired level.

FIG. 2 illustrates the make-up of inverter 66. The make-up of inverter 66 is identical to that of inverter 70, and the discussion that follows applies equally to both inverters 66 and 70. The input to inverter 66 is the drain voltage of transistor 42, and is coupled to the gates of transistors 86 and 88. The source of transistor 86 is coupled to $V_{cc}$ and the drain of transistor 86 is coupled to the drain of transistor 88. These common coupled drains are the output of inverter 66. The source of transistor 88 is coupled to the gate and drain of transistor 90. The source of transistor 90 is coupled to ground.

When capacitor 14 is not charged to the desired level, transistor 42 is off and a voltage close to $V_{cc}$ appears on the drain of transistor 42. Thus, transistor 86 of inverter 66 is off, and transistors 88 and 90 are on, producing a low output from inverter 66 approximately equal to the threshold voltage of transistor 90. When capacitor 14 is charged to the desired level, a voltage appears on the drain of transistor 42 at a level of approximately 3 volts above ground due to the voltage drop across transistors 42 and 47. Because the gate of transistor 90 is coupled to its drain, transistor 90 never turns off, and provides a higher voltage than ground to the source of transistor 88. Thus, a high output will be generated by inverter 66 when capacitor 14 is charged to the desired level, since transistor 88 will then turn off.

In summary, a method and apparatus for detecting changes in a clock signal to static states is provided that is capable of outputting a signal in response to an input signal being held at a particular state for a given amount of time. By linearly charging a capacitor with a current bias and coupling the capacitor to a differential pair driven by a predetermined voltage, consistently reproducible capacitors and transistors dictate the time constant of the circuit.

Although the present invention has been described in detail, it should be understood the various changes, substitutions, and alterations can be made hereto without departing from the spirit and scope of the invention as solely defined by the appended claims.

What is claimed is:

1. An integrated circuit for detecting when a clock signal which normally alternates between first and second logic states periodically to provide a series of clock pulses at a given clock pulse cycle frequency has been held at said first or second logic state for a given amount of time, comprising:

an input terminal for receiving the clock signal;

an output terminal;

a reference voltage terminal connected to receive a reference voltage;

a first capacitor having a first electrode connected to ground and a second electrode;

a second capacitor having a first electrode connected to ground and a second electrode;

a first transistor having a gate coupled to the input terminal, a source coupled to ground, and a drain coupled to the first capacitor second electrode, configured to discharge the first capacitor when the clock signal applied at the input terminal is in the first logic state;

an inverter;

a second transistor having a gate coupled through the inverter to the input terminal, a source coupled to ground, and a drain coupled to the second capacitor second electrode, configured to discharge the second capacitor when the clock signal applied at the input terminal is in the second logic state;

a current mirror circuit coupled between a voltage source and ground, configured to charge the first and second capacitors increasingly over time at a constant dV/dt rate, when the capacitors are not being discharged by the first and second transistors;

a first differential pair of transistors coupled to the first capacitor, the reference terminal and the output terminal, configured to generate a first output level at the output terminal when voltage developed on the first capacitor due to charging reaches a predetermined relationship relative to the reference voltage applied at the reference voltage terminal, the relationship indicative of charging the first capacitor for at least the given amount of time; and a second differential pair of transistors coupled to the second capacitor, the reference terminal and the output terminal, configured to generate a second output level at the output terminal when voltage developed on the second capacitor due to charging reaches a predetermined relationship relative to the reference voltage applied at the reference voltage terminal, the relationship indicative of charging the second capacitor for at least the given amount of time.

2. The circuit of claim 1, wherein the first and second capacitors comprise MOS transistors having sources, drains and substrates connected to ground and gates respectively connected to the first and second transistor drains.

3. The circuit of claim 1, wherein the current mirror circuit comprises two current mirror circuits, one including a transistor coupled between a source of biasing current and ground, and the other including a first transistor coupled between the voltage source and the one current mirror circuit, a second transistor coupled between the voltage source and the first capacitor, and a third transistor coupled between the voltage source and the second capacitor.

4. The circuit of claim 3, wherein the reference voltage terminal comprises the output of a voltage divider circuit.

5. The circuit of claim 4, wherein the voltage divider circuit comprises a first transistor having a source coupled to the voltage source, a gate and drain coupled in common; a second transistor having a source coupled to the first transistor gate and drain, and a gate coupled to its drain; and a third transistor having a source coupled to the second transistor gate and drain, and a gate and drain commonly connected to ground.

* * * * *